United States Patent
Ke et al.

(10) Patent No.: US 7,861,105 B2
(45) Date of Patent: Dec. 28, 2010

(54) CLOCK DATA RECOVERY (CDR) SYSTEM USING INTERPOLATOR AND TIMING LOOP MODULE

(75) Inventors: Yanjing Ke, Union City, CA (US); Jianbin Hao, San Jose, CA (US); Ning Zhu, San Jose, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 748 days.

(21) Appl. No.: 11/823,002

(22) Filed: Jun. 25, 2007

(65) Prior Publication Data

US 2008/0320324 A1 Dec. 25, 2008

(51) Int. Cl.
*G06F 1/12* (2006.01)
*G06F 11/00* (2006.01)
(52) U.S. Cl. .................. 713/401; 713/503; 714/704
(58) Field of Classification Search .......... 713/400, 713/500, 503, 401; 714/704
See application file for complete search history.

(56) References Cited

U.S. PATENT DOCUMENTS

| | | | |
|---|---|---|---|
| 5,485,490 A | 1/1996 | Leung et al. | |
| 5,642,386 A | 6/1997 | Rocco, Jr. | |
| 5,646,968 A | 7/1997 | Kovacs et al. | |
| 5,910,740 A | 6/1999 | Underwood | |
| 5,939,912 A | 8/1999 | Rehm | |
| 5,990,968 A | 11/1999 | Naka et al. | |
| 6,085,345 A | 7/2000 | Taylor | |
| 6,100,733 A | 8/2000 | Dortu et al. | |
| 6,111,446 A | 8/2000 | Keeth | |
| 6,125,157 A | 9/2000 | Donnelly et al. | |
| 6,166,572 A | 12/2000 | Yamaoka | |
| 6,172,937 B1 | 1/2001 | Ilkbahar et al. | |
| 6,178,212 B1 | 1/2001 | Akashi | |
| 6,201,423 B1 | 3/2001 | Taguchi et al. | |
| 6,570,944 B2 | 5/2003 | Best et al. | |
| 6,661,862 B1 | 12/2003 | Butcher | |
| 7,095,816 B2 | 8/2006 | Kishine et al. | |
| 7,135,905 B2 | 11/2006 | Teo et al. | |
| 2003/0038659 A1 | 2/2003 | Takahashi et al. | |
| 2003/0154336 A1* | 8/2003 | Ballantyne et al. | 710/110 |
| 2004/0161070 A1* | 8/2004 | Yin et al. | 375/371 |
| 2006/0098771 A1 | 5/2006 | Cafaro et al. | |
| 2006/0188051 A1 | 8/2006 | Donnelly et al. | |
| 2006/0262891 A1 | 11/2006 | Faulkner | |
| 2007/0064462 A1* | 3/2007 | Matsui | 365/63 |
| 2008/0002652 A1* | 1/2008 | Gupta et al. | 370/338 |

OTHER PUBLICATIONS

International Search Report and Written Opinion of the International Searching Authority Dated Jun. 24, 2008, International Application No. PCT/US2008/002565.

* cited by examiner

*Primary Examiner*—Chun Cao
(74) *Attorney, Agent, or Firm*—Blakely Sokoloff Taylor & Zafman LLP

(57) ABSTRACT

The present invention provides a method and mechanism for data recovery with phase synchronized clock using interpolator and timing loop module and a data latching circuit. The interpolator can be considered as a programmable delay circuit with a specified delay resolution over the clock period.

11 Claims, 4 Drawing Sheets

CLOCK DATA RECOVERY (CDR) SYSTEM USING INTERPOLATOR AND TIMING LOOP MODULE

BACKGROUND OF THE INVENTION

1. Field of the Invention

The present invention relates to data recovery with phase synchronized clock using interpolator and timing loop module and a data latching circuit.

2. Prior Art

To communicate data from one device to another across signal lines, the receiving device must know when to sample the data signal that it receives from the transmitting device. In many systems a dedicated high frequency clock signal is sent along with data signals. Sending a high frequency clock along with the data is costly and the line quality is difficult to control, resulting in errors. Sending a low frequency reference clock and regenerating the frequency and phase relationship to data from the reference clock has been used in the past to achieve data transfer. As data bit rates have increased, the accuracy requirement for the regenerated clock in terms of frequency and phase have become critical. Typically a phase lock loop (PLL) has been used to generate the necessary frequency waveform. The phase alignment has not been easily achieved, especially if the transmission frequency changes over time.

The receiving device can use the data clock sent as part of the signals to internally regenerate a high frequency data clock, which is used to latch the data signal if the proper phase relationship can be achieved. Alternately an oscillator in the receiver is used to generate a high frequency clock that has a frequency close to the data clock in the transmitter. This generated clock is used as reference to regenerate the correct data clock phase and frequency in the receiver, if it is possible to achieve. The receiving device requires a clock alignment and regeneration circuit such as a PLL and/or delay locked loop (DLL) to regenerate the correct clock frequency from the reference clock signal and synchronize the clock to the input data. The clock data recovery (CDR) circuit is used to output data and synchronized clock using the reference clock input with the necessary built in circuits.

FIG. 1 is a block diagram showing the principle of a Clock Data Recovery circuit (CDR). The transmitter 101 transmits data to the remote receiver 111, the data clock 102 is also transmitted to the receiver, though the high speed clock transmission with good integrity between the transmitter and receiver is difficult. Typically this reference data clock 112 sent from the transmitter is sent to the receiver to allow rough synchronization between the transmitted data and clock. Using this clock a PLL, DLL combination reproduces a data clock. This clock will be at a different phase than the transmission clock and needs to be adjusted to achieve correct synchronization of clock and data in the recovered clock data steam. This phase optimization is necessary to ensure noise margin and correct synchronization in the output data.

DETAILED DESCRIPTION OF THE PREFERRED EMBODIMENTS

A reference clock (Ref. clk, see FIG. 2A), typically with a frequency (f/n) of $1/10^{th}$ of the data clock (f) at the transmitter, is provided with the data stream to enable a phase lock loop (PLL), used in the receiver, to recover the data clock frequency and some sense of the phase relationship with the data. The PLL output generated, is a signal having the data clock frequency and phase using this reference clock as input for recovery of data, still may not be coherent, i.e., there may be some parts per million (ppm) difference between the local reference clock and the input high-speed data which comes through a different path, having a different path length, and possibly from different boards with slightly different clock frequencies. Hence these differences need to be adjusted and corrected in the CDR for efficient clock and data recovery.

The present invention provides a method and mechanism for data recovery with a phase synchronized clock using an interpolator, a timing loop module and a data latching circuit. The interpolator can be considered as a programmable delay circuit with a specified delay resolution over the clock period, a typical delay resolution that may be used is $1/128$ of the clock period. The clock path and the data path are separated at the input of the receiver. The data input is passed through an equalizer, which equalizes the input serial data stream by compensating the high-frequency loss of the incoming data and hence opens the data-eye for better data-latching. Thus the inputs to the clock and data recovery circuit 200 are the serial data and the reference clock.

Figure 1:
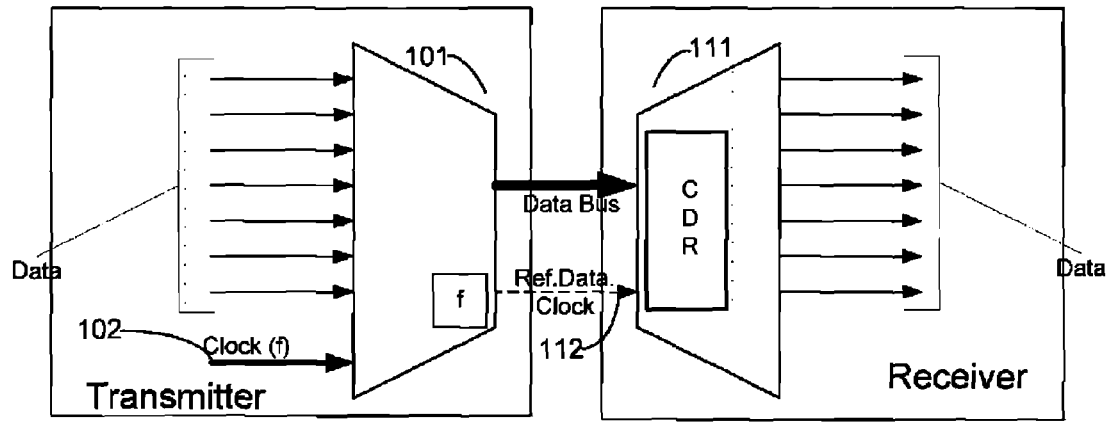
FIG. 1 shows a prior art system with clock data recovery (CDR).
Figure 2:
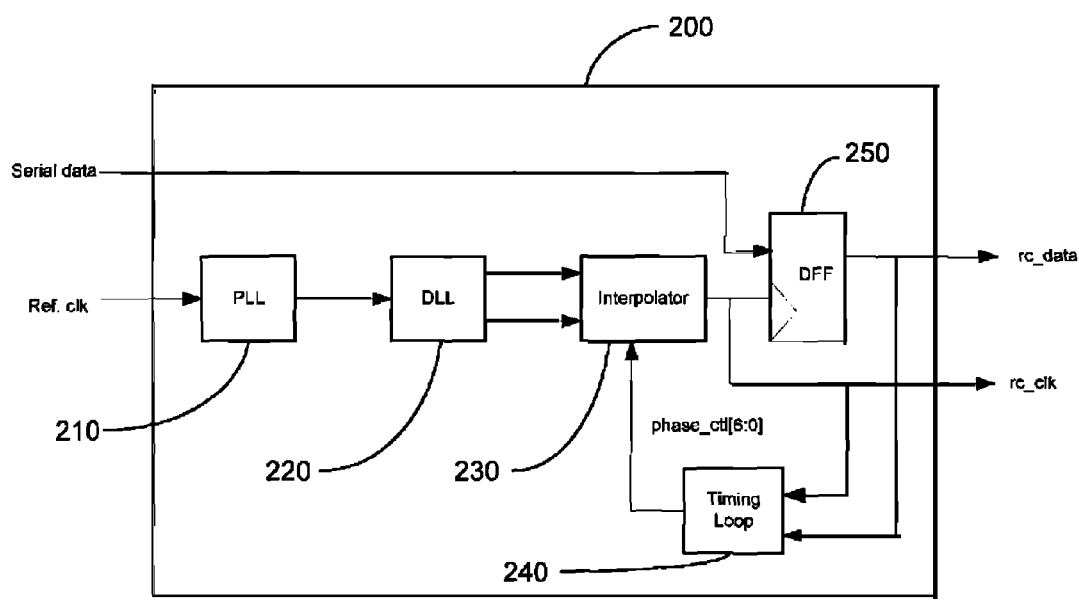
FIG. 2 is a block diagram of a CDR in accordance with the principles of the disclosed invention.
Figure 2A:
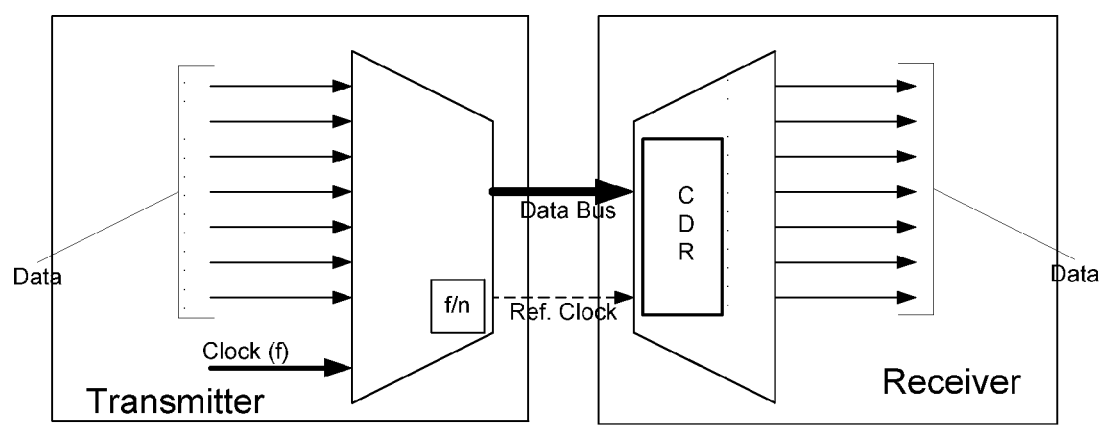
FIG. 2A shows a system of the current invention with CDR.

In the disclosed CDR 200 implementation of FIG. 2, the reference clock whose frequency is generally $1/10^{th}$ of the transmitter clock is received and supplied to a PLL 210. The PLL 210 generates a 10× clock from the reference clock frequency with phase synchronization with the reference clock. The PLL output goes to a delay locked loop (DLL) 220 to generate several sub clocks, each of which has the same frequency as the output of the PLL while having different phases. The multiple phase clocks are coupled to an interpolator 230 that outputs the recovered clock with a phase that is synchronous with the serial data.

The interpolator 230 is controlled by a timing-loop module 240 placed in a feedback loop. The timing-loop module 240 takes the data output of the interpolator as input and judges the phase relationship between the recovered clock (rc_clk) and the output data (rc-data) and provides a feedback to the interpolator 230 by outputting a phase-control signal, for example, a seven bit phase-control signal. This signal is decoded and used by the interpolator 230 to select the correct phased-clock from the DLL (220). It also further incrementally adjusts the phase of the selected clock to provide the rc_clk, all in a manner to be subsequently described.

The interpolator 230, data latching circuit 250, comprising a D-Flip Flop (DFF), and the timing-loop module 240 together form a closed-loop system which continuously adjusts the phase of the rc_clk and in steady state will guarantee the recovered clock is synchronous with the data input. The timing-loop module 240, used in the feedback loop of the disclosed CDR circuit 200, can handle up to a ±100 ppm ($1/10,000$) difference between the reference clock and the input data without error, and provide a stable recovered clock and data.

The interpolator 230 is implemented as a programmable delay circuit. The circuit provides a delay resolution in a the typical implementation of 1/128 of the clock period. A seven bit delay control signal is generated by the timing-loop module comparing the phase relationship between the output data and the output clock. The timing-loop module 240 gets the feedback of the data latching circuit 250 which uses the chosen delayed clock output to latch the incoming data. The timing-loop module 240 adjusts the 7-bit delay control outputs to choose the correct phased clock. It further adjusts the clock's phase between itself and the adjacent clock based on the feedback until the data latching circuit latches the correct data and sends out the correct feedback signal.

Figure 3:
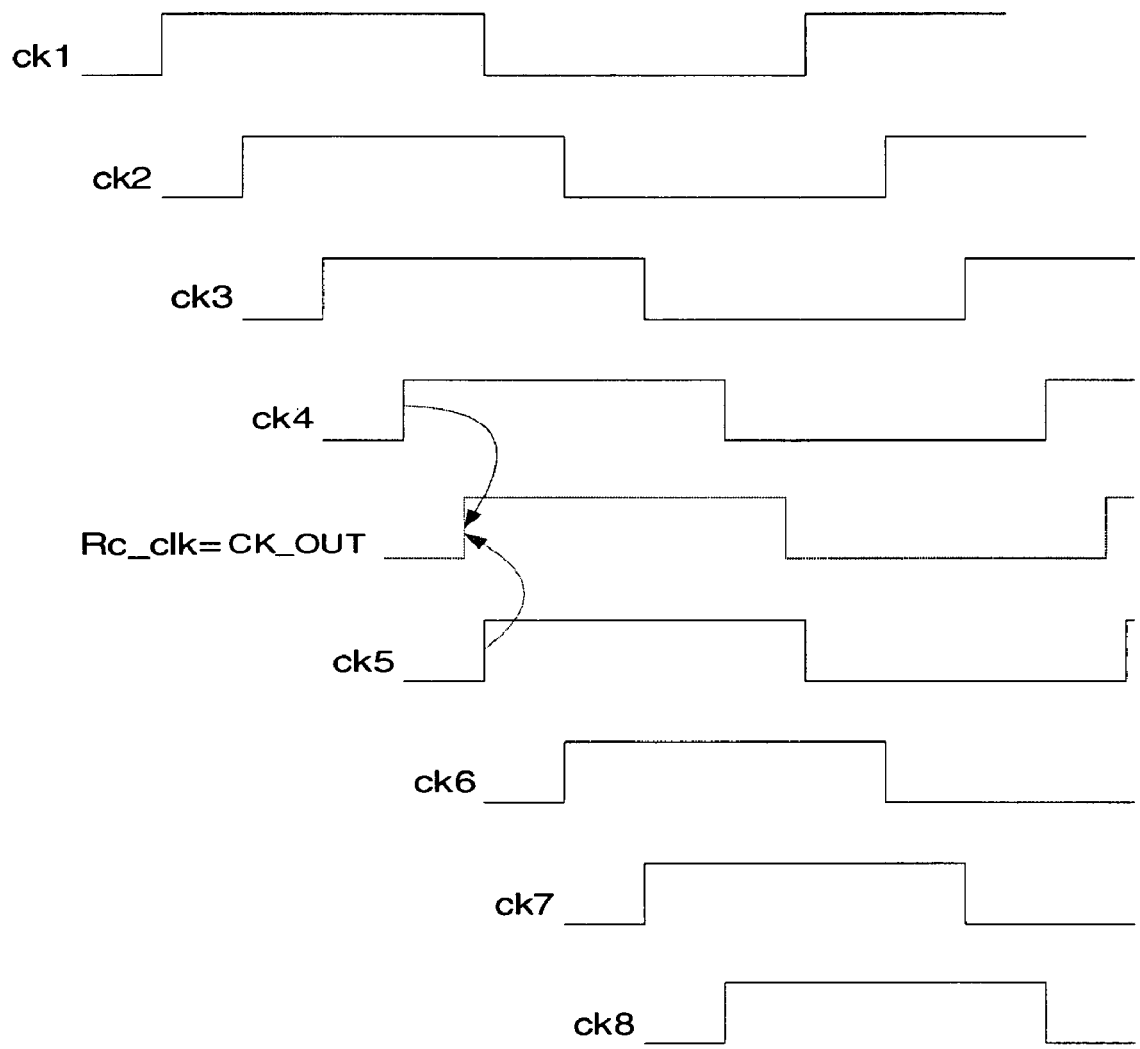
FIG. 3 is a timing diagram of the interpolator output.

The output of the interpolator 230, with the eight phased clocks having different incremental phase delays, is shown in FIG. 3. The selected phased clock from the DLL, that is shown chosen is the clk4. The further phase adjusted clock is shown as the recovered clock, rc-clk which is the output clock that is used to latch the input data at the center of the data eye and is synchronous with data.

The interpolator 230, the timing-loop module 240 and the data latching circuit 250, together form a closed loop feedback system which converges into the correct recovered data and correct recovered clock phase which continuously monitors and adjusts the recovered signals for correct phase and frequency relationships.

Figure 4:
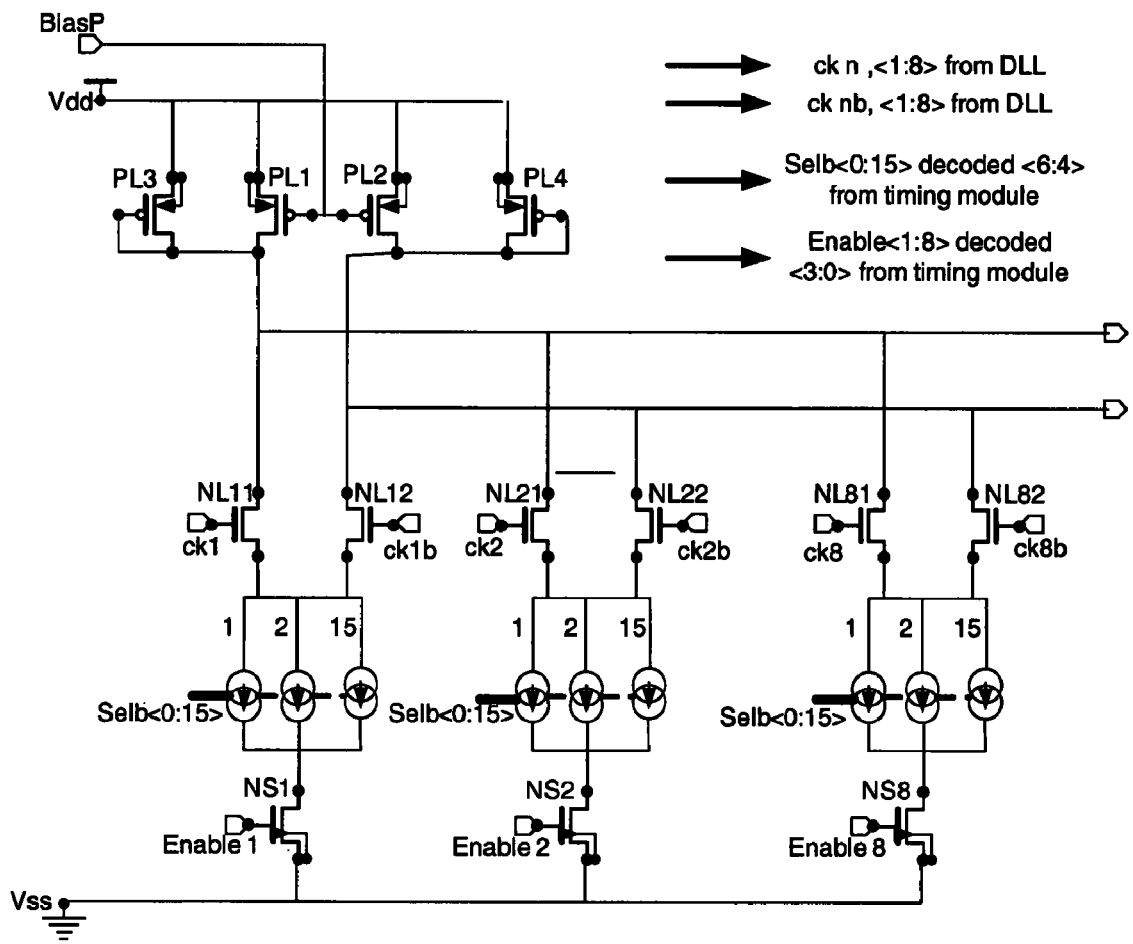
FIG. 4 is a schematic diagram of the interpolator block.

In the schematic diagram of interpolator 230 shown in FIG. 4, the enable_x (x=1 ... 8) and sel<x> (x=1 ... 15) signals are generated by the timing-loop module 240 output phase_ctl[6:0]. The three bit phase_ctl[6:4] decoded decide which of the eight enable_x signals are selected. The four bit phase_ctl[3:0] when decoded generates the 16 bit sel<x> signals. Eight phased clocks ck1 to ck 8 are also shown as input into the interpolator from the DLL. (ck 1 and ck 1b denote one phased clock input into the interpolator from the DLL.)

Enable_1 through enable_8 signals decoded from the three bits [6:4] out of the seven bits from the timing loop module select one of the 8 branches and hence one of the phased clocks. The sel<1:15> which is decoded from the four bits [3:0] of the output of the timing loop module select the driving current of the selected clock branches. Different values of sel<1:15> will determine the CK_OUT phase relative to the phase of the selected clock. Using the select signals the phase of the chosen clock is adjusted between the adjacent clock that is next to the selected clock and the initial phase of the chosen clock when sel=0 of the selected clock.

Figure 5:
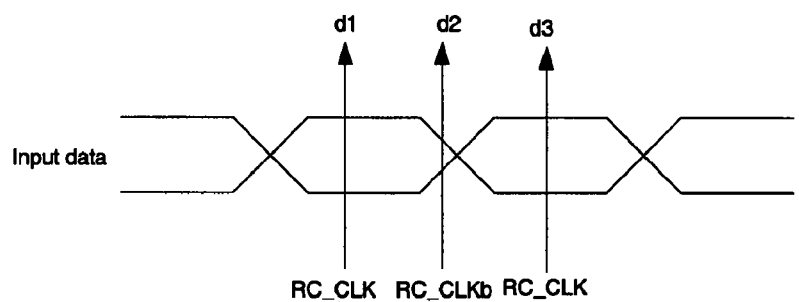
FIG. 5 is a timing diagram of the CDR Timing_loop operation.

The operation of the timing loop module 240 shall be now described. The timing-loop module takes 'up' and 'down' signals as input. The 'up' and 'down' signals are generated from the latched data by RC_CLK and RC_CLKB in the timing loop module. RC_CLK is 'CK_OUT' from interpolator module 230 and RC_CLKB is the inversion of RC_CLK. Referring to FIG. 5, d1 is the recovered data from RC_CLK (0 or 1) and d2 is the recovered data from RC_CLKB (again 0 or 1).

| | |
|---|---|
| up = ~(d1 xor d2) | when d1 != d3, |
| 0 | when d1 = d3; |
| down = d1 xor d2 | when d1 != d3, |
| 0 | when d1 = d3; |

When RC_CLK is not at the center of the input data eye, then 'd1' and 'd2' signals will always be the same polarity if RC_CLK is to the left of the data eye, or always be the opposite polarity if RC_CLK is to the right of the data eye. When either of these happen, there will be either more up value or more down value for the sum of d1 and d2. The timing-loop module 240 assesses the sign and adds up the 'up' signal and the 'down' signal in each cycle, then it calculates the difference between the sum of up's and the sum of down's. If there are more up's than down's, the 'phase_ctl[6:0]' output will increment causing RC_CLK to shift to the right. Otherwise if there are more down's than up's then 'phase_ctl[6:0]' output will decrement causing RC_CLK to shift to the left by an amount proportional to the difference number. The large differences change the high order bits from the timing loop module to move the Enable<8:1> and select a correct phased-clock input from the DLL. The smaller differences change the low order bits from the timing loop module and are used to adjust the selb<0:15> and optimize the phase of the selected phased-clock to achieve best result. When 'RC_CLK' is roughly at the center of the data eye, then there is equal opportunity that 'd2' has the same amplitude but is the opposite of 'd1', causing roughly equal up's and down's and the 'phase_ctl' output will stay unchanged. The 'up' and 'down' signals are generated only when the data line toggles, otherwise the timing-loop will not have information to know when to adjust the phase.

This optimized clock that is generated using the feedback loop enables the capture and latching of the input data at the center of the data eye, thereby reducing the error rate and improving the noise margin of the recovered data. Hence the CDR circuit at the input of the receiver regenerates and recovers the correct clock and enables the latching and recovery of the correct data transmitted. This recovered clock and data are used by the rest of the receiver circuits for further processing.

What is claimed is:

1. An apparatus for data clock and data recovery in a communication transmitter-receiver system comprising:
    a reference clock signal input, the reference clock signal to be received over a communication channel from a transmitter and having a fixed, divide by an integer "N", frequency relationship to the data clock;
    a data input enabled to receive data transmitted at the data clock rate;
    a phase locked loop (PLL) having its input connected to the reference clock signal input to generate a signal having a frequency equal to the data clock, and with a phase relationship to the data clock;
    a delay locked loop (DLL) coupled to said PLL to generate multiple clock signals with the data clock frequency but with fixed successive phase delays between the multiple clock signals;
    an interpolator coupled to said DLL to select a clock signal from the clock signals generated, and further to adjust the phase of the selected clock signal in a delay circuit based on a feedback received to provide a recovered data clock signal;
    a latch, coupled to a recovered data clock output of the interpolator and to the data input, to provide a latched data output;
    a digital feedback loop, including a timing loop module, coupled to the latched data output and the interpolator, and generating the feedback to the interpolator, the feedback having at least a seven bit resolution;
    such that the recovered data clock signal has the same frequency and phase as the received data to automatically enable the latch to latch data at the center of a data eye, thereby recovering the data clock and data with high noise margin and low error rate.

2. The recovered clock of claim 1 wherein the recovered data clock is synchronous with the input data.

3. The apparatus of claim 1, wherein the latch latches the data at the recovered data clock edge.

4. The apparatus of claim 1, wherein the timing loop module provides the feedback to the interpolator by comparing the output clock of the interpolator with the latched data, enabling the choice of one of a plurality of phased clocks and the further adjustment of the phase of the chosen phased clock to cause the interpolator to output the recovered data clock synchronous with the data.

5. A method of recovering data and data clock, using a clock and data recovery (CDR), from an incoming data stream and a reference clock having a frequency of 1/N times the data clock, where N is an integer comprising:

regenerating and outputting a data clock frequency for latching the data using the reference clock;

generating a plurality of phased clocks having the same frequency as the regenerated data clock frequency but having different delayed phases;

choosing a phased clock from the plurality of phased clocks;

latching the data input using the chosen phased clock;

comparing the data latched by the phased clock and the data latched by the inverse of the phased clock;

generating a feedback based on the difference between the latched outputs;

using the feedback for choosing the one phased clock from the plurality of phased clocks; and further using the feedback to adjust the phase of the chosen phased clock, said feedback being a digital feedback with at least seven bits to improve available phase resolution;

such that the chosen phased clock with adjusted phase latches the input data at the center of a data eye providing the correct recovered data at a recovered data output of the CDR and further providing the chosen phased clock as adjusted in phase as a recovered data clock output of the CDR.

6. The method of claim 5, wherein generating the data clock frequency comprises:

using a phase locked loop (PLL) with the reference clock received as an input.

7. The method of claim 5, wherein generating the phased clocks having different delayed phases comprises: using a delayed latched loop (DLL).

8. The method of claim 5, wherein the data latching using the chosen phased clock as adjusted in phase comprises:

using a flip-flop.

9. The method of claim 5, wherein comparing the latched data using the chosen phased clock and data latched using the inverse of the chosen phased clock and generating feedback comprises using a timing loop.

10. The method of claim 5, wherein selecting the right phased clock and further adjusting the phase of the selected clock based on the feedback comprises:

using an interpolator.

11. The method of claim 6, wherein using the reference clock as an input to the PLL allows the regenerated data clock to track the data clock frequency with low jitter.

* * * * *